(12) United States Patent
Bowlby et al.

(10) Patent No.: US 7,630,876 B1
(45) Date of Patent: Dec. 8, 2009

(54) METHOD AND SYSTEM FOR FILTERING UNKNOWN VALUES IN ASIC DESIGN SIMULATION

(75) Inventors: Gavin J. Bowlby, Vista, CA (US); Aklank H. Shah, Ladera Ranch, CA (US); Abraham F. Tabari, Irvine, CA (US)

(73) Assignee: QLOGIC, Corporation, Aliso Viejo, CA (US)

( * ) Notice: Subject to any disclaimer, the term of this patent is extended or adjusted under 35 U.S.C. 154(b) by 474 days.

(21) Appl. No.: 11/257,693

(22) Filed: Oct. 25, 2005

(51) Int. Cl.
*G06F 17/50* (2006.01)
*G06G 7/62* (2006.01)

(52) U.S. Cl. .............................. 703/14; 703/13; 703/15; 716/4

(58) Field of Classification Search ............... 703/13–15
See application file for complete search history.

(56) References Cited

U.S. PATENT DOCUMENTS 3,715,573 A * 2/1973 Vogelsberg .................. 714/33

\* cited by examiner

*Primary Examiner*—Kamini Shah
*Assistant Examiner*—Saif Alhija
(74) *Attorney, Agent, or Firm*—Klein, O'Neill & Singh, LLP

(57) ABSTRACT

Method and system for application specific integrated circuit (ASIC) simulation, wherein the ASIC includes plural logical elements is provided. The method includes, monitoring transitions at an output of a logic element of the ASIC; checking if the transition is to an unknown value (X); verifying if the unknown value is based on a design error; forcing the output of the logic element to a known value if the unknown is an unwanted condition; propagating the known value to logic elements in the ASIC; and releasing the known value after a next command.

20 Claims, 4 Drawing Sheets

METHOD AND SYSTEM FOR FILTERING UNKNOWN VALUES IN ASIC DESIGN SIMULATION

BACKGROUND

1. Field of the Invention

This invention relates in general to the field of application specific integrated circuits ("ASICs"), and more specifically, to simulation and debugging techniques used to filter unknown values.

2. Background of the Invention

Application Specific Integrated Circuits ("ASICs") are commonly used in various computing functions. Typically, while an ASIC is being designed and before a foundry fabricates it, the ASIC is verified and tested in a simulation environment. After fabrication, the ASIC is tested to perform in real life situations using lab equipment.

ASICs are first designed in a hardware description language ("HDL") and then synthesized to logical components, like registers flip-flops, AND gates, and OR gates.

Flip-flops are logical sequential elements that store logical digital values, for example, 1 and 0. Inputs to a conventional flip-flop are clock, data and a write enable signals. The clock signal oscillates at a regular interval; data is sampled at the transition of the clock signal and at the assertion of write enable signal. The output of a typical flip-flop is either 1 or 0.

Simulations are typically run using simulators to verify the functionality of an ASIC design. Simulation includes monitoring, forcing, checking and releasing actions using simulator language constructs.

The simulator has the ability to create a logical X (unknown logic level) when inputs to a component (for example, a flip-flop) violate set-up or hold time requirements for the component. These set-up and hold times are often specified to the simulator.

When a simulation fails, different debugging techniques are used to debug the failure mechanisms. One technique is to propagate the X value from a logic element (for example, a flip-flop) to the rest of the ASIC logic elements. This technique works well if the generated X value is based on a true error. However, not all X values are based on true errors. For example, X values originate from a register that is constructed from bits in different clock domains. If the register is not synchronized to both clock domains, then the simulator due to timing violations originates an X value. Such X values are not design related and are propagated to the rest of the design, resulting in an early termination of the simulation process. This is undesirable because it impedes the overall simulation process.

Therefore, what is needed is a method and system to filter localized unwanted X's from the rest of the design, while preserving the global checks that the simulator performs to create X's for legitimate timing violations that should be propagated through the design.

SUMMARY OF THE INVENTION

A method for ASIC simulation is provided. The method includes, monitoring transitions at an output of a logic element of the ASIC; checking if the transition is to an unknown value (X); verifying if the unknown value is an unwanted condition; forcing the output of the logic element to a known value if the transition is an unwanted condition; propagating the known value to logic elements in the ASIC; and releasing the known value after a next command.

In another aspect, an ASIC simulation system is provided. The simulation system includes a computing system with a processor coupled to an application specific integrated circuit ("ASIC") simulator, wherein the computing system includes a processor for executing code for monitoring transitions at an output of a logic element of the ASIC; checking if the transition is to an unknown value (X); verifying if the unknown value is an unwanted condition; forcing the output of the logic element to a known value if the transition is an unwanted condition; propagating the known value to logic elements in the ASIC; and releasing the known value after a next command.

This brief summary has been provided so that the nature of the invention may be understood quickly. A more complete understanding of the invention can be obtained by reference to the following detailed description of the preferred embodiments thereof concerning the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures.

DETAILED DESCRIPTION OF THE PREFERRED EMBODIMENTS

In one aspect of the present invention, a logic element's (for example, a flip-flop) out-put is monitored to see if it has been set to an unknown value (X). The process verifies if the X value is based on a true design error and if it is not based on a true design error, then the X value is forced to a known value (for example, 1 or 0). The process continues to monitor future writes to the logic element and when a new write enable signal is received, the forced value is disabled.

To facilitate an understanding of the preferred embodiment, the general architecture and operation of a simulation system will be described. The specific architecture and operation of the preferred embodiment will then be described with reference to the general architecture.

Simulation Environment

Figure 1A:
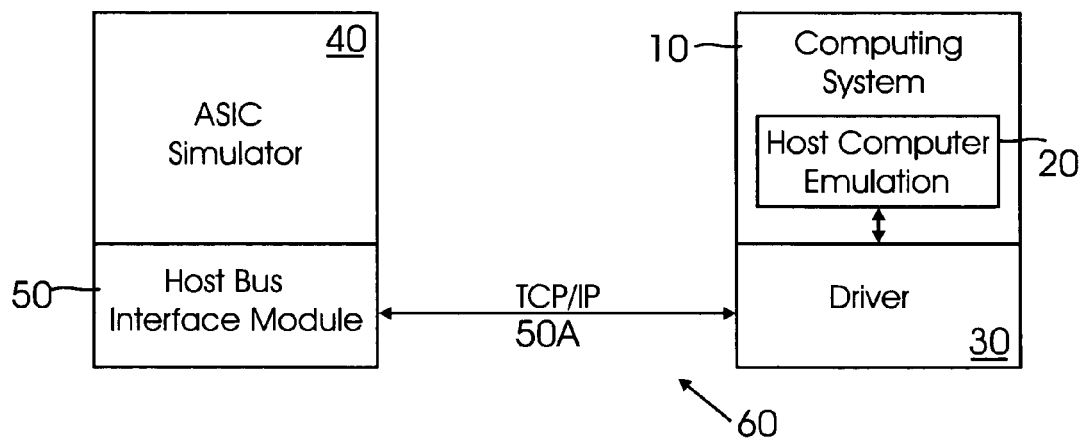
FIG. 1A shows a block diagram of a simulation environment for an ASIC.

FIG. 1A shows a top-level block diagram of a system 60 for testing ASICs, according to one aspect of the present invention.

System 60 includes the ASIC simulator 40, which can be a standard hardware description language simulator. Simulator 40 interfaces with a host bus interface functional module (also referred to as "HIBFM") 50. HIBFM 50 can be configured to receive any stimulus from computing system 10.

Host system/computing system 10 uses a host computer emulation ("HCE") program (or module) 20 that interfaces with a driver 30 that interfaces with HIBFM 50. There are standard emulation programs, for example, VMware available from VMWare Corp. and VirtualPC available from Microsoft® Corporation, used to emulate real hardware to software. Software executing in the HCE 20 environment believes that it is interfacing with hardware components, while in fact it is interfacing with software that behaves like hardware. HCE 20 interfaces with HIBFM 201 via driver 30, using for example, a TCP/IP link 50A.

Figure 1B:
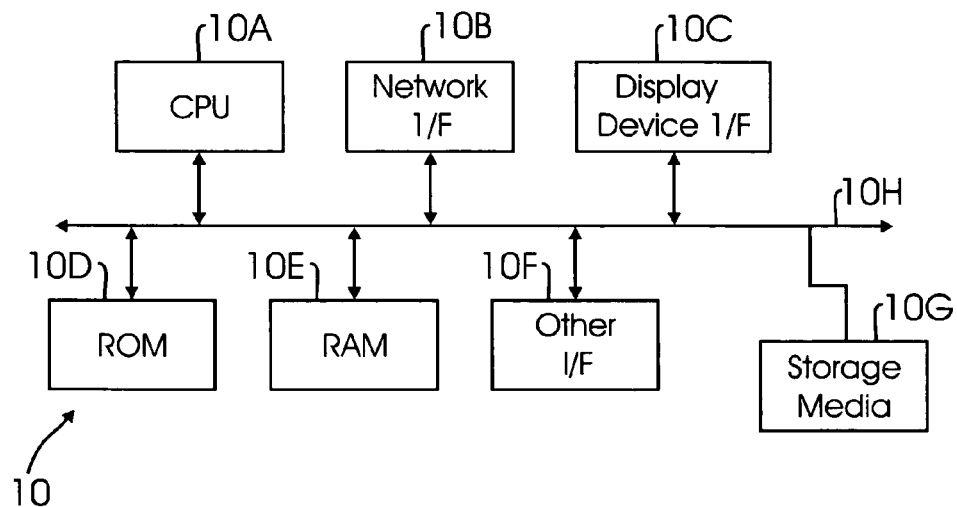
FIG. 1B shows a block diagram of a computing system used for performing the simulation.

Before describing the adaptive aspect of the present invention, the following describes the overall architecture of computing system 10, with respect to FIG. 1B. As shown in FIG. 1B, system 10 includes a central processing unit "CPU" 10A for executing computer-executable process steps and interfaces with a computer bus 10H. Also shown in FIG. 1B are a network interface 10B, a display device interface 10C, interface for various other devices (for example, a mouse, keyboard and others) 10F and storage media (for example, hard drive, CD-ROM, CD-R/W, flash memory, tape drive and others) 10G.

Storage media 10G stores operating system program files, application program files, and other files. Some of these files are stored on using an installation program. For example, CPU 10A executes computer-executable process steps of an installation program so that CPU 10A can properly execute the application program.

A random access main memory ("RAM") 10E also interfaces to computer bus 10H to provide CPU 10A with access to memory storage. When executing stored computer-executable process steps from storage media 10G, CPU 10A stores and executes the process steps out of RAM 10E.

Read only memory ("ROM") 10D is provided to store invariant instruction sequences such as start-up instruction sequences or basic input/output operating system (BIOS) sequences.

Network Interface 10B allows computing system 10 to connect (for example, using TCP/IP link 50A, FIG. 1A) with other systems via a network.

It is noteworthy that the foregoing systems are merely to illustrate the adaptive aspects of the resent invention. The architecture and block diagrams may have fewer or more components to execute the process steps described below.

Undesirable X's Propagation

Figure 1C:
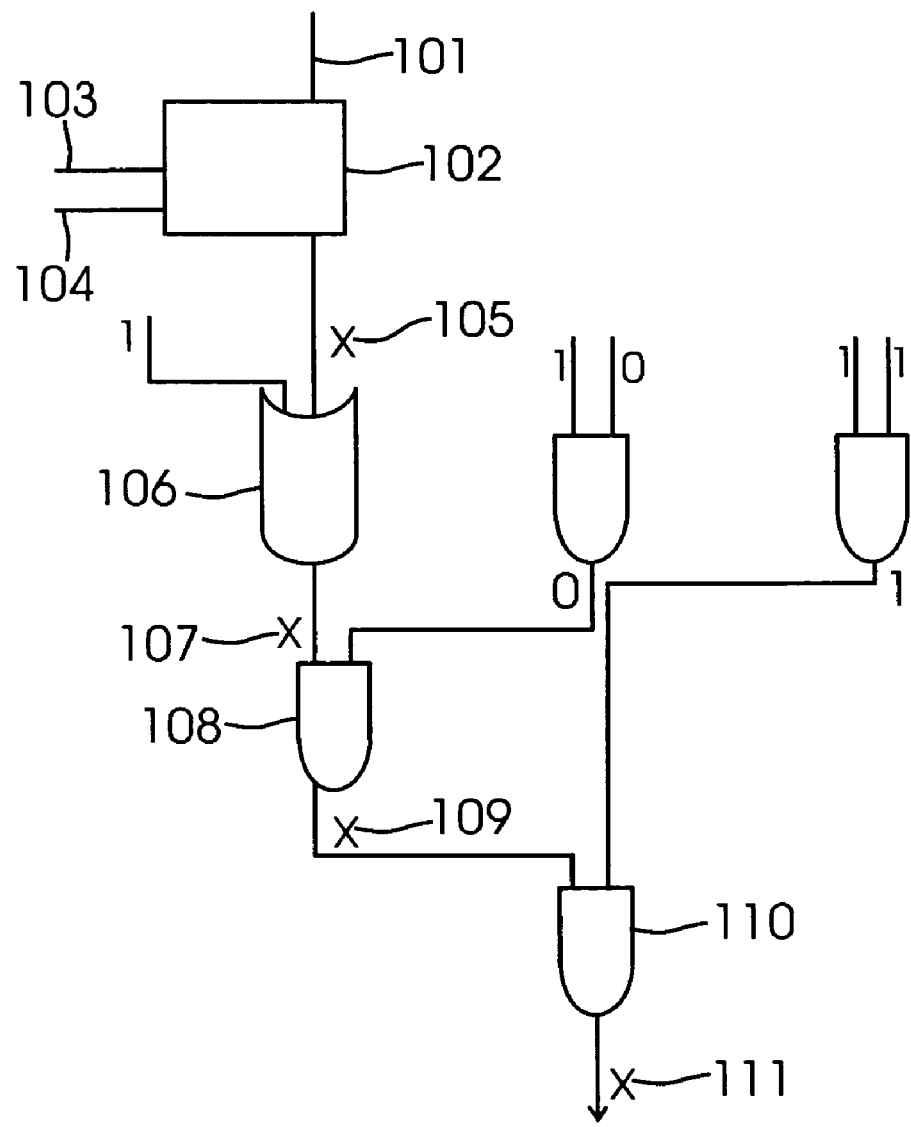
FIG. 1C is an example showing the undesirable propagation of unknown values (X's)

Before describing the adaptive aspects of the present invention, the undesirable propagation of X's is described with respect to FIG. 1C.

After simulation is started, logic values are propagated throughout the ASIC design. Flip-flop 102 samples input data 101 at the transition of the input clock 104 and at the assertion of the input write enable 103.

If the output 105 of the flip-flop transitions to an X, it gets propagated to the inputs of all the logical components that the output is connected. In the example shown in FIG. 1C, the output of the flip-flop is connected to one of the inputs of logical component 106. The other input to this logical component is a logical 1. Since one of the inputs to this logical block is an unknown value X, the output 107 is also an unknown value X. This propagation continues to the rest of the outputs (i.e. 109 and 111) of the logical components 108 and 110 respectively. This abruptly ends the simulation process. If the X is based on an unwanted condition and not an ASIC design error, then the simulation disruption is not necessary.

Process Flow Diagram

Figure 2:
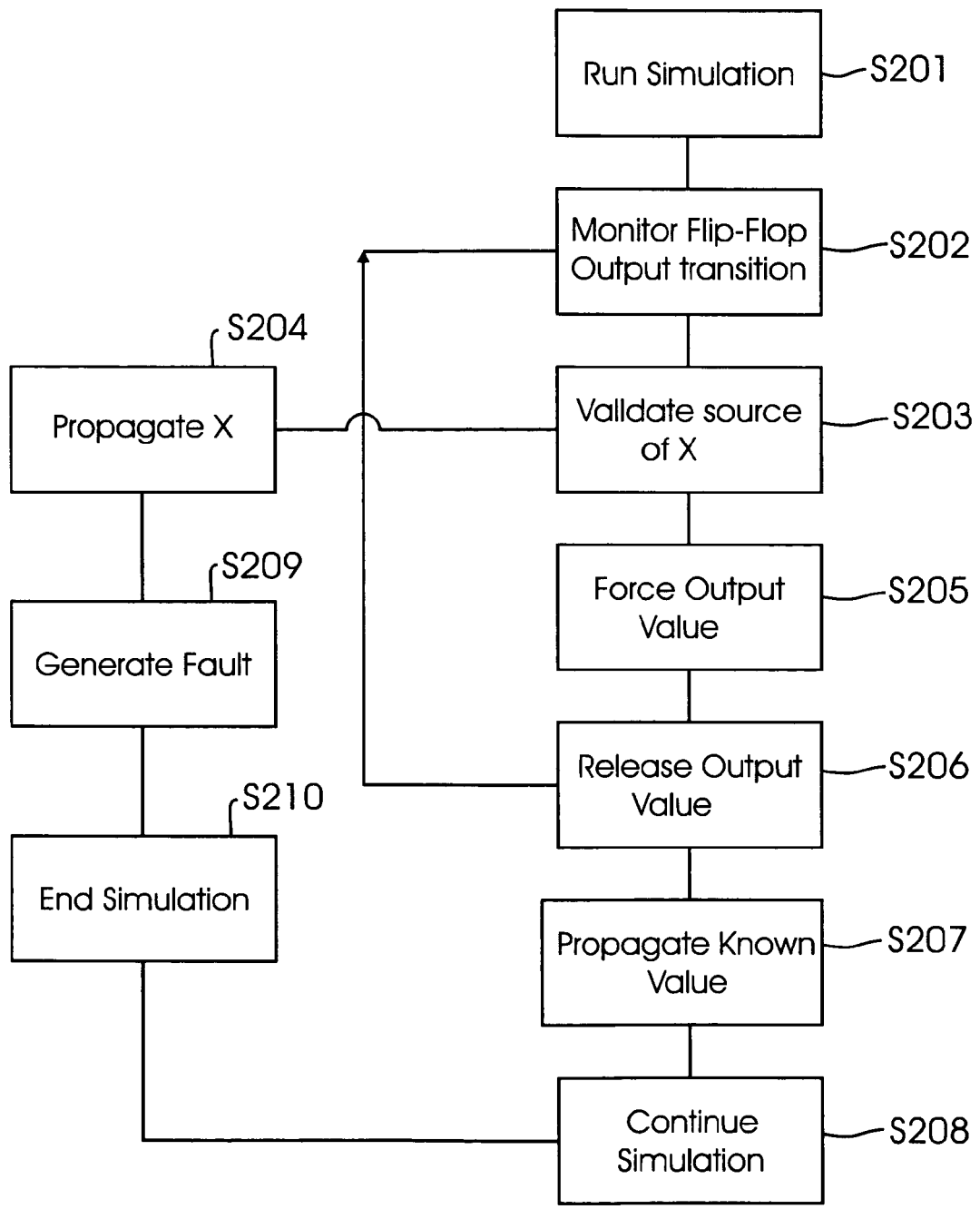
FIG. 2 shows a flow diagram for debugging ASIC simulations by selectively propagating X's, according to one aspect of the present invention.

FIG. 2 shows a flow diagram for debugging ASIC simulations by selectively propagating X's, according to one aspect of the present invention.

The process begins in step S201, when the simulation for the ASIC is started using a simulator tool (for example, as shown in FIG. 1A and mentioned above). In step S202, state transitions are monitored at the output of a logical element (for example, a flip-flop 102). The process monitors the initial non-X values at a flip-flop, the most recent non-X value and the X values.

If the transition of an output is to an X, then in step S203, the source of the X value is checked/validated. This is to ascertain if the X value is based on a design error or if the X value creates an unwanted condition. If the source of the X is determined to be a real condition (for example, based on a design error), then the X value is propagated to the rest of the design (i.e. other elements of the ASIC) in step S204. Simulation ends in step S210 when a fault is encountered (or generated due to the propagation of X's) in step S209.

If X is determined to be an unwanted condition (based on the source verification in step S203) then in step S205, the output of the logic element is forced to a known logic value, for example, 0 or 1. It is noteworthy that the forced value is based on the last non-X value that was written to a flip-flop (or any other logic) that is tracked in step S202. According to the present invention, this action suppresses the propagation of the unwanted X values to the rest of the design.

In Step S206, the output of the logic element is released from the forced condition after a write enable signal (for example, 103) is de-asserted at the input of the logic element.

In step S207, the known logic value is propagated to the rest of the design and simulation progresses to step S208 without terminating. Thereafter, simulation ends in step S210.

It is noteworthy that multiple logic segments (for example, multiple flip-flops) can exhibit unwanted conditions based on the X values. Hence, each piece of logic is handled separately, i.e., initial non-X value (during logic initialization) and the last non-X value before the X value is received are tracked. The X value conditions are validated as described above and for unwanted conditions an output value is forced (instead of propagating the X value throughout the design).

Figure 3:
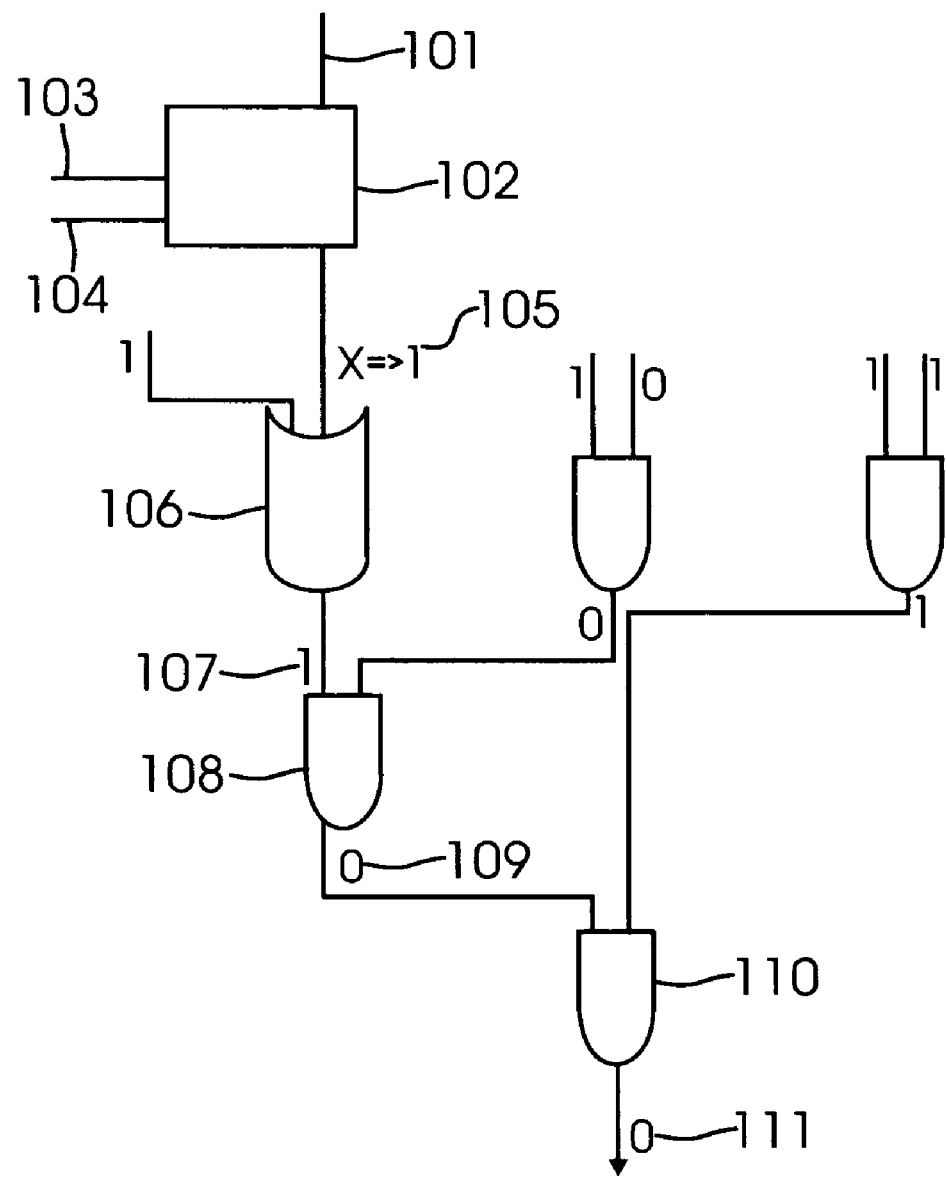
FIG. 3 illustrates filtering localized X's, according to one aspect of the present invention.

FIG. 3 illustrates filtering of localized X's using the foregoing method of the present invention. The logic element used to illustrate the adaptive aspects of the present invention is a flip-flop (similar to FIG. 1C). Flip-Flop 102 samples input data and the transitions at the output are monitored (as shown in step S202). If the transition is to an unknown value X, and the source of the X is found to be an unwanted condition, then the output 105 is forced to a known logic value, in this example, to logic high or 1. This known logical value (1) then propagates to outputs 107, 109, 111 of the rest of the logical components 108, 110. This allows the simulation to continue without unnecessary disruption.

According to one aspect of the present invention, forcing the output of the flip-flop suppresses the propagation of unknown value. Hence, simulation runs efficiently to the desired end point without being terminated abruptly.

Although the present invention has been described with reference to specific embodiments, these embodiments are illustrative only and not limiting. Many other applications and embodiments of the present invention will be apparent in light of this disclosure and the following claims.

What is claimed is:

1. A method for application specific integrated circuit (ASIC) simulation, wherein the ASIC includes plural logical elements, comprising;
    (a) providing an ASIC simulator, the ASIC simulator configured to emulate the ASIC and configured to communicate with a computing system and receive stimulus from the computing system;

(b) monitoring transitions at an output of a logic element of the ASIC by the computing system, after assertion of an enable command to the logic element;

(c) checking if the transition at the output of the logic element is to an unknown value (X);

(d) verifying if a source of the unknown value X at the output is an unwanted condition and not a real error condition, by checking if an input value to the logic element is also an known value; and if the unknown input value is due to a design error, then concluding that the unknown value (X) at the output to be a real error condition, if not, concluding the unknown value (X) at the output to be an unwanted condition;

(e) forcing the output of the logic element to a known value if the source of the unknown value is an unwanted condition and not a real error condition as determined in step (d);

(f) propagating the known value to logic elements in the ASIC; and (g) releasing the known value at the output of the logic element after deassertion of the enable command to the logic element received in step (b).

2. The method of claim 1, wherein the logical element is a flip-flop.

3. The method of claim 2, wherein said transitions are checked for all flip-flops in the ASIC.

4. The method of claim 1, wherein said transition is to a 1, 0 or X.

5. The method of claim 1, wherein the enable command is a write enable command.

6. The method of claim 1, wherein a non-X value is propagated through logical components connected to the output of the logical element whose output transitions to an unwanted X value.

7. The method of claim 1, wherein said step of verifying the source of the unknown value is an unwanted condition and not a real error condition, comprising:
  sampling the unknown value at an input of a flip-flop;
    determining if a source of the unknown value is an unwanted condition and not a real error condition depending on whether the unknown value is based on a design error; and
    concluding that the unknown value is an wanted condition and not a real error condition if the unknown value is not based on a design error.

8. The method of claim 7, wherein the sampling comprises: checking for an unknown value at a transition of a clock; and when a write enable signal is asserted.

9. A simulation system, comprising:
a computing system;
an ASIC simulators the ASIC simulator configured to emulate the ASIC and configured to communicate with the computing system and receive stimulus from the computing system; wherein
the computing system includes a processor for
executing code for monitoring transitions at an output of a logic element of the ASIC, after assertion of an enable command to the logic element;
checking if a transition at the output of the logic element is to an unknown value (X); verifying if a source of the unknown value at the out put is an unwanted condition and not a real error condition, by checking if an input value to the logic element also an unknown value; and if the unknown input value is a design error, then concluding that the unknown value (X) at the output to be a real error condition, if not, concluding that the unknown value (X) at the output to be an unwanted condition;

forcing the output of the logic element to a known value if the source of the unknown value is an unwanted condition and not a real error condition; propagating the known value to logic elements in the ASIC; and releasing the known value at the output of the logic element after de-assertion of the enable command to the logic element.

10. The system of claim 9, wherein the logical element is a flip-flop.

11. The system of claim 10, wherein said transitions are checked for all flip-flops in the ASIC.

12. The system of claim 9, wherein said transition is to a 1, 0 or X.

13. The system of claim 9, wherein the enable command is a write enable command.

14. The system of claim 9, wherein a non-X value is propagated through logical components connected to the output of the logical element whose output transitions to an unwanted X value.

15. The system of claim 9, wherein verifying if the source of the unknown value is an unwanted condition and not a real error condition, comprising:
  sampling the unknown value at an input of a flip-flop;
  determining if a source of the unknown value is an unwanted condition and not a real error condition depending on whether the unknown value is based on a design error; and
  concluding that the unknown value is an wanted condition and not a real error condition if the unknown value is not based on a design error.

16. The system of claim 15, wherein the sampling comprises:
  checking for a value X at a transition of a clock; and when a write enable signal is asserted.

17. The method of claim 1, wherein if the unknown value (X) at the output is a real error condition, propagating the unknown value (X) through logic components connected to the output of the logic element whose output transitioned to the unknown value (x).

18. The method of claim 1, wherein the ASIC simulator further includes a host bus interface functional module (HIBFM) and the computing system includes a host computer emulation module (HCE), the HCE configured to communicate with the HIBFM so as to exchange commands between the computing system and the ASIC simulator.

19. The system of claim 9, wherein if the unknown value (X) at the output is a real error condition, propagating the unknown value (X) through logic components connected to the output of the logic element whose output transitioned to the unknown value (X).

20. The system of claim 9, wherein the ASIC simulator further includes a host bus interface functional module (HIBFM) and the computing system includes a host computer emulation module (HCE), the HCE configured to communicate with the HIBFM so as to exchange commands between the computing system and the ASIC simulator.

* * * * *

UNITED STATES PATENT AND TRADEMARK OFFICE
CERTIFICATE OF CORRECTION

PATENT NO. : 7,630,876 B1  Page 1 of 1
APPLICATION NO. : 11/257693
DATED : December 8, 2009
INVENTOR(S) : Gavin J. Bowlby et al.

It is certified that error appears in the above-identified patent and that said Letters Patent is hereby corrected as shown below:

In column 4, line 63, in claim 1, delete "comprising;" and insert -- comprising: --, therefor.

In column 5, line 9, in claim 1, delete "known" and insert -- unknown --, therefor.

In column 5, line 51, in claim 9, delete "simulators" and insert -- simulator --, therefor.

In column 5, line 61, in claim 9, delete "out put" and insert -- output --, therefor.

In column 6, line 44, in claim 17, delete "(x)" and insert -- (X) --, therefor.

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,630,876 B1 Page 1 of 1
APPLICATION NO. : 11/257693
DATED : December 8, 2009
INVENTOR(S) : Gavin J. Bowlby et al.

It is certified that error appears in the above-identified patent and that said Letters Patent is hereby corrected as shown below:

Title page (*) Notice

Delete "by 474 days" – and insert --by 595 days--

Signed and Sealed this

Twenty-fourth Day of August, 2010

David J. Kappos
*Director of the United States Patent and Trademark Office*